United States Patent
Kaneko et al.

(10) Patent No.: US 7,432,176 B2
(45) Date of Patent: Oct. 7, 2008

(54) METHOD OF THREE-DIMENSIONAL MICROFABRICATION AND HIGH-DENSITY THREE-DIMENTIONAL FINE STRUCTURE

(75) Inventors: Tadaaki Kaneko, Hyogo (JP); Naokatsu Sano, Hyogo (JP); Kiyoshi Sakaue, Hyogo (JP)

(73) Assignee: Riber, Bezons (FR)

(*) Notice: Subject to any disclaimer, the term of this patent is extended or adjusted under 35 U.S.C. 154(b) by 169 days.

(21) Appl. No.: 11/578,034

(22) PCT Filed: Apr. 13, 2004

(86) PCT No.: PCT/JP2004/005262
§ 371 (c)(1),
(2), (4) Date: Dec. 7, 2006

(87) PCT Pub. No.: WO2005/101470
PCT Pub. Date: Oct. 27, 2005

(65) Prior Publication Data
US 2007/0232029 A1    Oct. 4, 2007

(51) Int. Cl.
*H01L 21/20* (2006.01)
*H01L 21/36* (2006.01)

(52) U.S. Cl. .................. 438/487; 257/E21.134
(58) Field of Classification Search .......... 438/487, 438/483; 257/E21.134
See application file for complete search history.

(56) References Cited

U.S. PATENT DOCUMENTS

| 7,348,222 B2 * | 3/2008 | Shimomura et al. ......... 438/149 |
| 2003/0011515 A1 * | 1/2003 | Warble et al. ............... 342/372 |

FOREIGN PATENT DOCUMENTS

| JP | 3-192719 A | 8/1991 |
| JP | 8-264446 A | 10/1996 |

* cited by examiner

*Primary Examiner*—W. David Coleman
(74) *Attorney, Agent, or Firm*—Young & Thompson

(57) ABSTRACT

Surface of a thin film formed on a surface of substrate of $Al_xGa_yIn_{1-x-y}As_zP_{1-z}$ ($0 \leq x < 1$, $0 \leq y$ and $z \leq 1$) including substances GaAs and InP is irradiated with electron beams controlled at any arbitrary electron beam diameter and current density so as to cause any natural oxide film formed on GaAs surface to undergo selective $Ga_2O_3$ substitution or formation. Thereafter, the temperature of the substrate is adjusted to given temperature so as to effect detachment of the natural oxide film at region other than that of $Ga_2O_3$ substitution. Selective growth of a Group III-V compound semiconductor crystal is carried out on the substrate on its side of natural oxide film detachment in accordance with the molecular beam epitaxial growing technique to thereby achieve an increase of substrate density. On-site formation of a circuit pattern having the crystal film thickness along the direction of crystal growth uniformalized on the order of nanometers is accomplished.

14 Claims, 3 Drawing Sheets

(a)

(b)

(c)

METHOD OF THREE-DIMENSIONAL MICROFABRICATION AND HIGH-DENSITY THREE-DIMENTIONAL FINE STRUCTURE

TECHNICAL FIELD

The present invention relates to a three-dimensional very-fine patterning method in which a Group III-V compound semiconductor crystal is epitaxial-grown on a compound semiconductor of $Al_xGa_yIn_{1-x-y}As_zP_{1-z}$ according to the molecular beam epitaxy method.

BACKGROUND ART

The optical fine pattern lithography has now reached the limit to further development, and to keep the semiconductor-related industries still taking the part of traction in the economical and industrial field, development of a new paradigm to expand the horizon is a matter of great urgency. The nanotechnology is supposed to break the deadlock, releasing the fine pattern lithography from the yoke of complicatedness, large-size and high cost. What is aimed at is to provide a three-dimensional nano-fabrication art to meet the demand for producing a variety of devices in small quantities (design change permitted and low cost). Particularly from the angle of "photo electronics" non-contamination and non-deficiency are absolutely required, and the "batch production of devices" and "controlling permitted on site" are required, also.

There are two requirements for the lithography; improvement of throughput (related to the degree of sensitivity in the resist) and improvement of resolution (resolving power of the resist). These factors need to be balanced. The electron beam is shorter in wavelength than the light, and therefore the resolution limit in the optical lithography can be overcome by using the electron beam. From the point of throughput's view the organic resist has been generally used in the electron beam lithography as is the case with the optical lithography. The inorganic resist is good in resolution, but it has not been used because of the low sensitivity. Among the organic resists PMMA is generally used; it is relatively low in sensitivity, but is good in resolution. What is aimed at in developing inorganic resists is to improve the sensitivity of inorganic resists to the extent that it is equal to or exceeds the sensitivity of PMMA.

Another problem in the electron beam lithography is the commonly called "proximity effect", which is caused by the scattering of secondary electrons not only from the incident electron beam but also from the resist and the substrate. This makes the exposure region in the resist significantly larger than the size of the incident electron beam, and accordingly the resolution of inter-line space is lowered. In the hope of reducing the proximity effect every possible effort has been made. For one example, the proximity effect can be reduced by making an electron beam pass through a multi-layered resist prior to invasion in the substrate, thereby reducing the effective beam size thanks to the control of the refractive indexes of the electron beam. As a matter of fact, however, the proximity effect (enlargement of exposure area beyond the electron beam size) still limits the fine pattern lithography.

There are two kinds of resist sensitivity commonly taken into account: the digital type resist sensitivity and the analog type resist sensitivity. The digital type resist sensitivity shows a sudden change at a certain critical value, depending on the dose of the electron beam energy whereas the analog type resist sensitivity shows continuous change with the dose of the electron beam energy within a certain limited range. The digital type resist is advantageous to the sub-micron fine pattern lithography because of easiness in attaining a required space resolution. The "hard" reacted region formed therein is used as a mask, which functions to selectively permit etching or growth (called "regrowth") at a subsequent step. On the other hand, although the analog type resist is limited in space resolution, it can work as a "soft" mask in the subsequent processing, and therefore, it is used in fine pattern lithography while controlling the difference of elevation. To provide three-dimensional very fine structures as desired it is necessary to improve the analog type resist in space resolution and behavior in subsequent proceedings.

The selective growth processing subsequent to the finishing of the mask pattern uses a growth method using a gas species whose surface diffusion length is long (CVD, GSMBE or CBE); the mask pattern is generally made by the optical lithography, and therefore, the mask width (the region width in which the growth is to be selectively suppressed) is very large, and to cause the selective growth in the non-masking region the atoms of the raw growth material projected on the mask need to be eliminated by diffusion. Such selective growth is applied to every kind of compound semiconductor including GaN, and is used in the Si process as one practice established for making three-dimensional structures. In respect of sub-micron and still smaller three-dimensional structural control there is a problem of the very fine mask region being buried by the increased surface diffusion length of the gas species. The surface diffusion length needs to be short (although still longer than the mask width) in case of a relatively small mask region.

Patent Application Laid-Open No. H8-172053 discloses a selective growth using CVD method, particularly the selective growth on a Group III-V compound semiconductor according to the metal-organic chemical vapor deposition method (hereinafter referred to as "MOCVD").

The '053 publication uses the "MOCVD" method, and therefore the diffusion length of surface atoms is too long to permit the selective growth on a Group III-V compound semiconductor substrate, and therefore a high-density integration as desired cannot be attained thereon. The grown film thickness cannot be equal in the nano-order in all crystal growing directions, either.

In view of the above, one object of the present invention is to provide a three-dimensional very fine pattern lithography facilitating the "on-site", high-density integration on a substrate while its circuit patterns are controlled to be constant in crystal thickness in the nano-order in the crystal growth directions. Another object of the present invention is to provide a very fine, high-density three-dimensional structure.

DISCLOSURE OF THE INVENTION

A three-dimensional very fine patterning method according to the present invention comprises the steps of: preparing a substrate of a Group III-V compound semiconductor including $Al_xGa_yIn_{1-x-y}As_zP_{1-z}$ ($0 \leq x<1$, $0 \leq y$, $z \leq 1$); throwing on the substrate surface an electron beam whose current density is controlled in respect of the diameter of the beam, thereby selectively substituting a Group III oxide for the natural oxide formed on the substrate surface or selectively forming a Group III oxide; raising the temperature of the substrate to a predetermined temperature to allow the parts other than those substituted for or formed to detach from the substrate surface; and allowing the selective crystal growth of a Group III-V compound semiconductor on the natural oxide stripping side, particularly on the part substituted for by the Group III oxide or the region other than the part substituted for by the Group III oxide according to the molecular beam epitaxy method using a solid growth material.

Preferably a three-dimensional very fine structure according to the present invention is made by selective growth of the Group III-V compound semiconductor crystal on the part substituted for by the Group III oxide or in the region other than the part substituted for by the Group III oxide.

In the method according to the present invention the natural oxide formed on the crystal surface of the Group III-V compound semiconductor including $Al_xGa_yIn_{1-x-y}As_zP_{1-z}$ compound semiconductor is not removed, but the electron beam is injected into the natural oxide so that a Group III oxide may be formed in the state of being highly crystallized and chemically stable, and the part of the natural oxide other than the Group III oxide is detached by heating, thereby facilitating the forming of desired circuit patterns on the surface. In forming circuit patterns at a high density the diffusion length of surface atoms is controlled by controlling the growth condition in the MBE method so as to facilitate the selective growth of the Group III-V compound semiconductor, permitting the "on site" forming of circuit patterns with the crystal film constant in thickness in the growing directions in the nano-order. Advantageously the cost involved for forming circuit patterns at a high-density in the nano-order is relatively low.

BEST MODES OF REDUCING THE INVENTION TO PRACTICE

Figure 1:
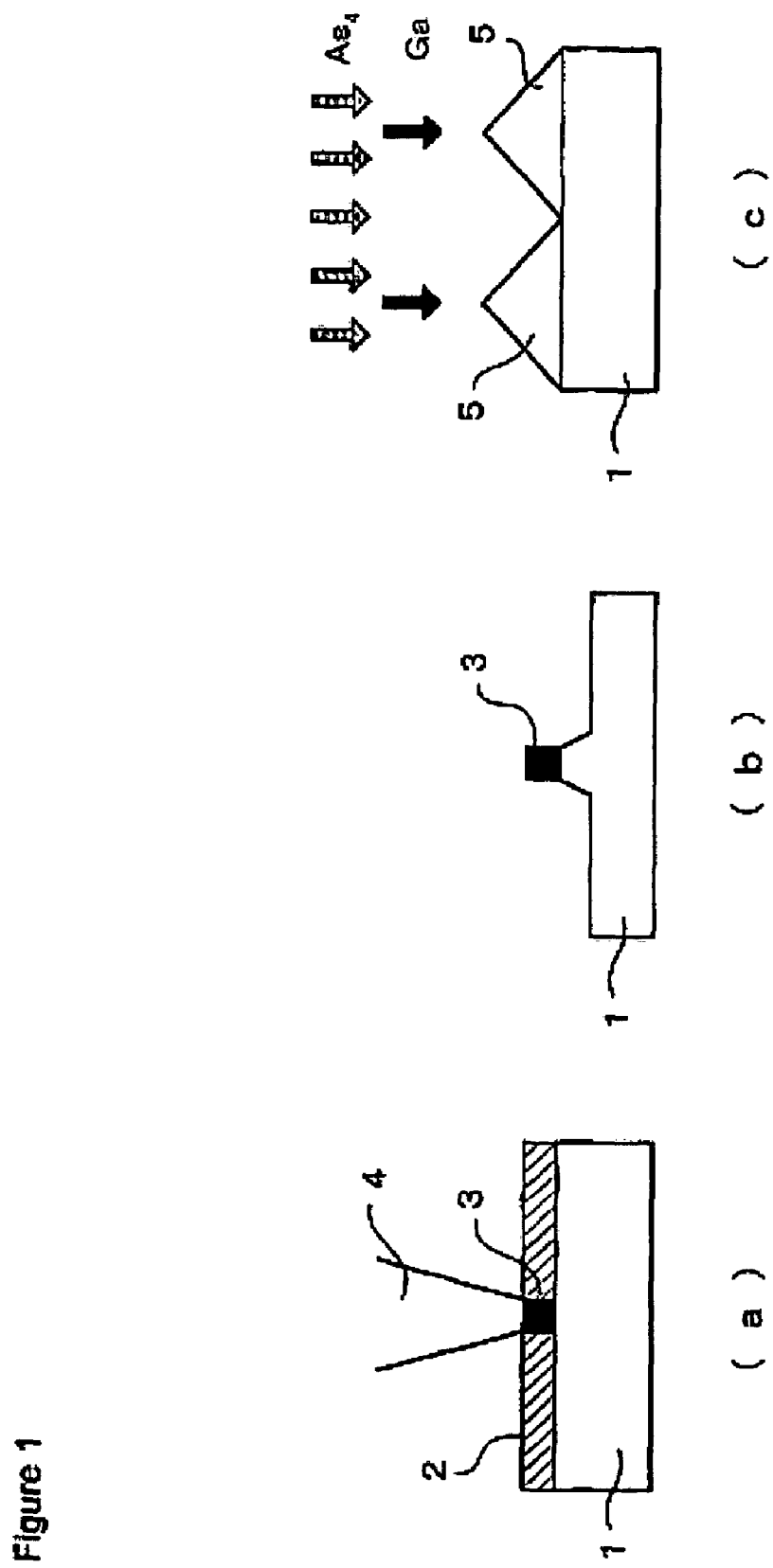
FIG. 1 illustrates a three-dimensional very fine pattern lithography according to the present invention.

A three-dimensional very fine pattern lithography according to one embodiment of the present invention and a three-dimensional high-density nano-structure according to one embodiment of the present invention are described below by referring to accompanying drawings. In FIG. 1, a GaAs layer 1 has a natural oxide 2 of $As_2O_3$, $As_2O$ and other oxides formed on its top surface.

In the three-dimensional very fine pattern lithography according to the present invention an electron beam 4 is thrown on the natural oxide 2 of $As_2O_3$ in vacuum, and then, the natural oxide 2 is not removed, remaining as it is. The throwing of the electron beam 4 on the natural oxide 2 substitutes a chemically stable oxide $Ga_2O_3$ for $As_2O_3$, $As_2O$ and other oxides on the top surface of the substrate 1 (see FIG. 1a). Preferably the electron beam is thrown in the single line scanning mode. The acceleration voltage ranges from 10 to 50 kV, and the line dose ranges from 10 nC/cm to 1 µC/cm. The GaAs layer 1 whose surface oxide 2 is partly substituted for by $Ga_2O_3$ is heated at the temperature ranging from 580 to 620° C. so that the part of the natural oxide 2 other than the $Ga_2O_3$ region is detached. Thus, the natural oxide part other than the $Ga_2O_3$ region and adjacent parts of the top surface of the substrate 1 are removed (see FIG. 1b). In the proceeding the electron beam is controlled to draw circuit patterns as desired on the top surface of the GaAs substrate 1 so that the circuit patterns may be formed on the top surface of the GaAs substrate 1.

Next, the selective growth of GaAs is permitted on the GaAs substrate in place of the removed natural oxide according to the MBE method, which is effected with following particulars: the direction in which GaAs is to be grown is aligned with the plane direction (100) of the GaAs substrate 1; the temperature at which GaAs crystal is allowed to grow ranges from 500 to 650° C.; the Ga atom-to-$As_4$ molecule flux ratio, $F_V/F_{III}$ ranges from 5 to 20; the crystal growth speed of GaAs is equal to 0.1 to 2 mL/sec (molecular layer/second: the growth speed estimated in terms of two-dimensional film), and the grown layer thickness of GaAs is approximately equal to the inter-line space of the electron beam.

The crystal growth speed of GaAs is controlled by using a reflective high-energy electron diffraction apparatus (abbreviated and hereinafter referred to as "RHEED") for "on site" observation. Determination of the crystal growth speed of GaAs permits the film thickness of the crystal growth of GaAs 5 to be controlled in terms of the time involved for the crystal growth of GaAs. Thus, there results a substrate having GaAs crystal growths 5 arranged at a high density, each constant in thickness (see FIG. 1c). The $Ga_2O_3$ plateau is supposed to be evaporated and disappear while GaAs crystal growths are being built with the electron beam whose effective dose is 50 nC/cm. Otherwise, in case the effective dose is more than 50 nC/cm, the plateau is supposed to be buried in GaAs growths although not illustrated.

As is apparent from the above, in the three-dimensional very fine pattern lithography according to the present invention the natural oxide such as $As_2O_3$ formed on the top surface of the GaAs layer needs not be removed, and an electron beam is thrown on the natural oxide to form $Ga_2O_3$ which is chemically stable. No matter how high the density of the circuit patterns may be, the selective growth of GaAs crystal can be permitted without difficulty by controlling the growth condition and adjusting the diffusion length of surface atoms in using the MBE method. The crystal film thickness in the crystal growing direction can be controlled so that the crystal film thickness may be constant in the nano-order, also. Still advantageously, the cost involved for circuit patterning at a high density is low in spite of the nano-fabrication. In the embodiment of the present invention the substrate is described as being made of GaAs, but as long as it is made of $Al_xGa_yIn_{1-x-y}As_zP_{1-z}$ ($0 \leq x<1$, $0 \leq y$, $z \leq 1$) the same effect as described above is caused, and therefore, the GaAs substrate should not be understood as restrictive.

Chemical growth of different compound semiconductors belonging to the Group III-V is permitted when the following condition or requirement is satisfied: the direction in which the electron beam is thrown is aligned with the crystal orientation in the substrate (100), (110), (111) and (−1−1−1); the temperature for crystal growth in the Group III-V compound semiconductor ranges from 300 to 650° C.; the Group V solid growth material molecule-to-Group III atom flux ratio $F_V/F_{III}$ ranges from 1 to 20; the growth speed of a Group III-V compound semiconductor ranges from 0.1 to 2 ML/sec (molecule layer/sec: the growth speed estimated in terms of two dimensional film); and the crystal growth film thickness of the Group III-V compound semiconductor is approximately equal to the line-to-line space of the electron beam for selective growth of the Group III-V compound semiconductor. Then, the width of the Group III oxide line is preferably controlled to be below the diameter of the electron beam. Preferably a variety of three-dimensional very fine structures are provided simply by controlling the irradiation interval of the electron beam, which is defined as the distance by which the electron beam is parallel-displaced to the adjacent line the electron beam is going to follow for subsequent scanning in the single line scanning mode. Preferably all the steps of the three-dimensional very fine pattern lithography are carried out in a single extreme high vacuum environment. Preferably an electron diffraction method is used in observing the top surface of the substrate on site while the crystal of the Group III-V compound semiconductor is growing according to the molecular-beam epitaxy method, thereby making it possible to control the crystal growth of the Group III-V compound semiconductor. Preferably the crystal shape of the Group III-V compound semiconductor grown in each small space delimited by the crossing lines drawn by the electron beam on the substrate varies with such small space size, the crystal orientation of the substrate and the film thickness of the crystal growth. Preferably the Group III-V compound semiconductor is GaAs, InAs or InP.

In the high-density three-dimensional integration of InAs, InP or any other Group III-V compound semiconductors adjacent three-dimensional very fine structures are separated below sub-microns.

The three-dimensional very fine pattern lithography and very fine structures according to the present invention are described above as being of negative type, but it should be noted that those of positive type can be provided by changing the crystal growth condition.

As is apparent from the above described embodiment, the natural oxide appearing on the top surface of a Group III-V compound semiconductor substrate including $Al_xGa_yIn_{2-x-y}As_zP_{1-z}$ is not removed, and an electron beam is injected in the natural oxide to form a Group III oxide, which is highly crystallized and chemically stable. The natural oxide region other than the Group III oxide is heated and removed to leave circuit patterns as desired. Thus, the desired circuit patterns can be formed without difficulty. No matter how high the density of the circuit patterns may be, the Group III-V compound semiconductor crystal can be easily grown on site at such increased density with the crystal film constant in thickness in the nano-order in the direction of crystal growth by controlling the growth condition in the MBE method, and hence the surface atomic diffusion length. Advantageously the nano-integration does not cost much.

The natural oxide which is partly modified in the very fine pattern lithography according to the present invention can be regarded as an inorganic resist, and then, the resist sensitivity in the molecular beam epitaxy method is found to be equal to the sensitivity of the organic resist PMMA, which is commonly used in the high-resolution lithography. The inorganic resist of natural oxide is highest of all inorganic resists both in sensitivity and resolution, and it can significantly improve the throughput compared with that in case inorganic resists are used.

The partial modification region of the natural oxide made by exposing to the electron beam is determined by the incident electron beam (the primary electrons) and the scattering electrons (the secondary electron) appearing in the natural oxide. In the subsequent processing in which the molecular beam epitaxy method using solid materials is applied to the modified region and the remaining surface of the substrate with the natural oxide removed, the crystal growth selectively appears in the region which is bombed with the electrons of high energy from the primary electron beam, and therefore the very fine structure can be controlled below the diameter of the electron beam in size.

The very fine pattern lithography according to the present invention is useful in making a variety of quantum elements such as a photonic crystal, a quantum fine line, a quantum box, a diffraction grating, a semiconductor laser structure or a micro-machine.

Some examples are given in the following. In each example irradiation onto the GaAs substrate was effected with the electron beam directed to the natural oxide such as $As_2O_3$ and other oxides appearing on the top surface of the substrate. The electron beam was 0.1 μm in diameter. The acceleration voltage was 30 kV; the beam current was $1\times10^{-8}$ A; and the line dose was 40 nC/cm. The growth crystal was GaAs, and the growth speed was determined and controlled by using a RHEED apparatus.

EXAMPLE 1

The electron beam was thrown in the plane direction (100) and the (−110) direction of the GaAs substrate 1 at the irradiation interval of 1.1 μm. As for the particulars of the subsequent crystallization on the GaAs substrate according to the MBE method: the GaAs crystal growth temperature was 580° C.; the Ga atom-to-$As_4$ molecular flux ratio $F_{As}/F_{Ga}$ was 10; the GaAs crystal growth speed was 0.2 ML/sec (molecular film/sec: growth speed estimated in terms of two dimensional film); and the GaAs crystal growth period was 20 min. The fine-patterned substrate was labeled "EXAMPLE 1".

EXAMPLE 2

The electron beam was thrown in the plane direction (100) and the (−110) and (110) directions of the GaAs substrate 1 at the irradiation interval of 6 μm. As for the particulars of the subsequent crystallization on the GaAs substrate according to the MBE method: the GaAs crystal growth temperature was 580° C.; the Ga atom-to-$As_4$ molecular flux ratio $F_{As}/F_{Ga}$ was 10; the GaAs crystal growth speed was 0.2 ML/sec (molecular film/sec: growth speed estimated in terms of two dimensional film); and the GaAs crystal growth period was 20 min. The fine-patterned substrate was labeled "EXAMPLE 2".

EXAMPLE 3

The electron beam was thrown in the plane direction (100) and the (−110) and (110) directions of the GaAs substrate 1 at the irradiation interval of 1.6 μm. As for the particulars of the subsequent crystallization on the GaAs substrate according to the MBE method: the GaAs crystal growth temperature was 580° C.; the Ga atom-to-$As_4$ molecular flux ratio $F_{As}/F_{Ga}$ was 10; the GaAs crystal growth speed was 0.2 ML/sec (molecular film/sec: growth speed estimated in terms of two dimensional film); and the GaAs crystal growth period was 20 min. The fine-patterned substrate was labeled "EXAMPLE 3".

Figure 2:
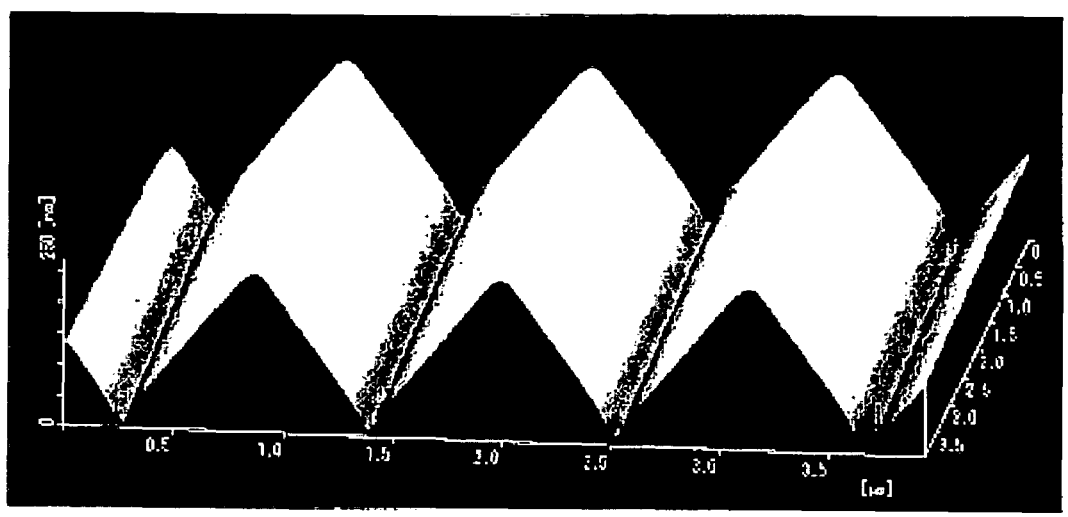
FIG. 2 is a photograph showing an AFM observation of the substrate surface in Example 1 of the three-dimensional very fine pattern lithography according to the present invention.
Figure 3:
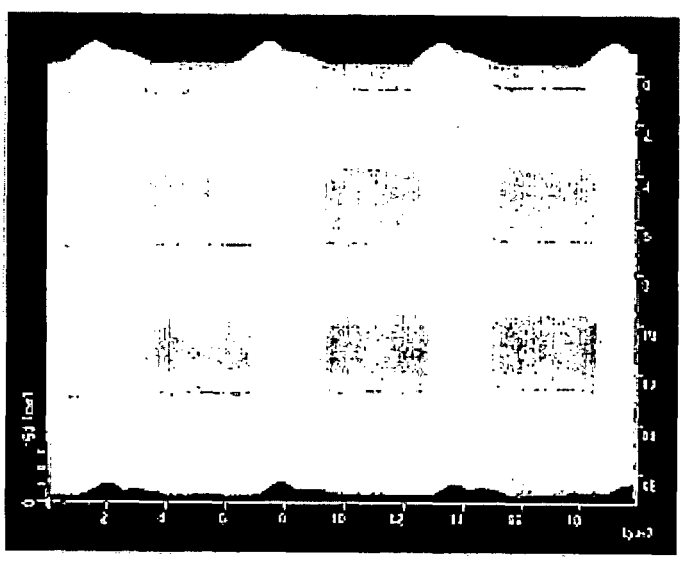
FIG. 3 is a photograph showing an AFM observation of the substrate surface in Example 2 of the three-dimensional very fine pattern lithography according to the present invention.
Figure 4:
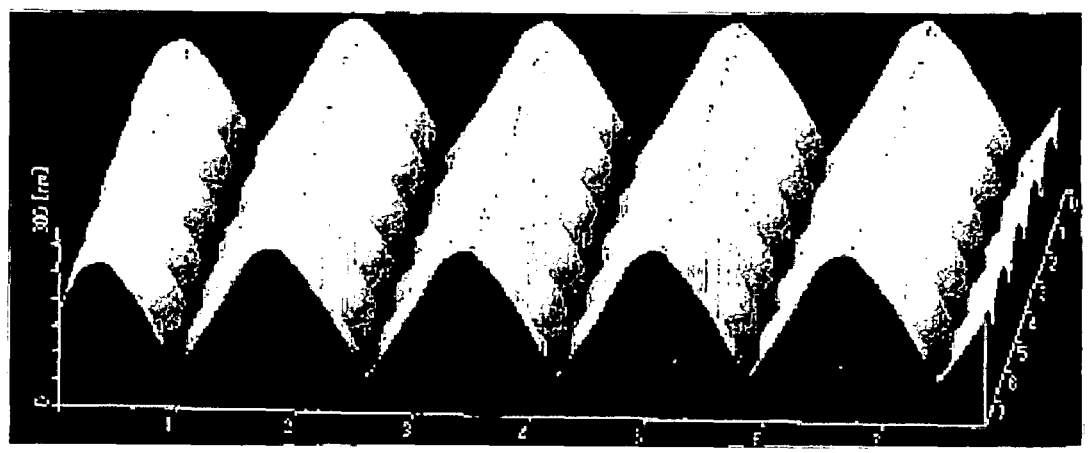
FIG. 4 is a photograph showing an AFM observation of the substrate surface in Example 3 of the three-dimensional very fine fabrication method according to the present invention.

FIGS. 2 to 4 are atomic force microscopic (AFM) observations of EXAMPLES 1 to 3. The condition for crystal growth according to the molecular beam epitaxy varies with a desired geometrical arrangement (line-to-line space, parallel lines or cross lines), and the patterns formed on the GaAs substrate function as negative masks. As seen from these AFM photographs, the three dimensional structures are built directly in the non-exposure region. Each three dimensional structural unit is formed from the stable facet, and is flat at an atomic level. These results reveal that the crystal growth is permitted in the region which is modified into $Ga_2O_3$ by the electron beam drawing, reducing to negligible size in respect of the diameter of the electron beam. A three dimensional structure having a recess made in the center of non-exposure region can be produced by increasing the line-to-line space of the electron beam. This is attributable to the fact that the diffusion length of surface atoms during the crystal growth is short relative to the line-to-line space, implying the possibility of producing a variety of complicated three-dimensional structures. It, therefore, might be justly said that a variety of circuit patterns can be provided by changing the condition for growth in the molecular beam epitaxy (MBE).

As is apparent from the above, injection of the electron beam into the natural oxide formed on the top surface of the GaAs substrate makes a chemically stable substance $Ga_2O_3$ appear in the natural oxide, and the condition for crystal growth in the MBE is changed to effectively control the patterning shape on the GaAs substrate in the nano-order. A series of processing in the very fine lithography can be carried out in one and same apparatus, thereby significantly reducing the manufacturing cost. The above described embodiments can be changed or redesigned without departing the spirit of the present invention as claimed, and therefore, the embodiments should not be understood as restrictive.

INDUSTRIAL UTILITY

An electron beam draws a desired circuit pattern on the top surface of a GaAs substrate. This is useful in fine pattern lithography, permitting desired circuit patterns to be easily provided with good reproducibility. The very fine pattern lithography can be applied to the production of semiconductor devices, wavelength discriminators, the micromachining, the fine fabrication of photonic crystals, micro-components, quantum fine line, and quantum boxes.

The invention claimed is:

1. A three-dimensional very fine patterning method comprising the steps of:
preparing a substrate of a Group III-V compound semiconductor including $Al_xGa_yIn_{1-x-y}As_zP_{1-z}$ ($0 \leq x < 1$, $0 \leq y$, $z \leq 1$);
throwing on the substrate surface an electron beam whose current density is controlled in respect of the diameter of the beam, thereby selectively substituting a Group III oxide for the natural oxide formed on the substrate surface or selectively forming a Group III oxide;
raising the temperature of the substrate to a predetermined temperature to allow the parts other than those substituted for or formed to detach from the substrate surface; and
allowing the selective crystal growth of a Group III-V compound semiconductor on the natural oxide stripping side, particularly on the part substituted for by the Group III oxide or the region other than the part substituted for by the Group III oxide according to the molecular beam epitaxy method using a solid growth material.

2. A three-dimensional very fine patterning method according to claim 1 wherein the acceleration voltage is selected in the range from 10 to 50 kV; the line dose quantities range from 10 nC/cm to 1 μC/cm and irradiation with the electron beam is effected in the single line scanning mode.

3. A three-dimensional very fine patterning method wherein all the steps of the three-dimensional very fine patterning method as defined in claim 1 are carried out in an ultra vacuum environment.

4. A three-dimensional very fine patterning method according to claim 1 wherein the Group III-V compound semiconductor crystal growth is controlled by using the electron diffraction method and by observing on site the surface of the substrate while the Group III-V compound semiconductor crystal is grown according to the molecular beam epitaxial deposition method.

5. A three-dimensional very fine patterning method according to claim 1 wherein the Group III-V compound semiconductor crystal shape grown in every very small section delimited by the crossing lines of the electron beam varies with the sectional area, the crystal orientation of the substrate and the crystal growth film thickness.

6. A high density, three-dimensional very fine structure provided by using the three-dimensional very fine patterning method according to claim 1, allowing the selective crystal growth of the Group III-V compound semiconductor on the part substituted for by the Group III oxide or the region other than the part substituted for by the Group III oxide.

7. A high density, three-dimensional very fine structure provided by using the three-dimensional very fine patterning method according to claim 1, adjacent three-dimensional very fine structures are separated below submicrons.

8. A three-dimensional very fine patterning method according to claim 2 wherein the direction in which the electron beam is thrown is aligned with the crystal orientation of the substrate (100), (110), (111), (-1 -1 -1); the growth temperature of the Group III-V compound semiconductor ranges from 300 to 650° C.; the flux ratio of the Group V molecule of the solid growth material to the Group III atom, $F_V/F_{III}$ ranges from 1 to 20; the crystal growth speed of the Group III-V compound semiconductor ranges from 0.1 to 2 ML/sec; the film thickness of the Group III-V compound semiconductor crystal growth is approximately equal to the line-to-line space of the electron beam, permitting the selective crystal growth of the Group III-V compound semiconductor.

9. A three-dimensional very fine patterning method according to claim 2 wherein the width of the Group III oxide is controlled to be below the diameter of the electron beam.

10. A three-dimensional very fine patterning method according to claim 2 wherein a variety of three-dimensional very fine structures of different shapes are made simply by controlling the irradiation interval of the electron beam.

11. A high density, three-dimensional very fine structure provided by using the three-dimensional very fine patterning method according to claim 2, allowing the selective crystal growth of the Group III-V compound semiconductor on the part substituted for by the Group III oxide or the region other than the part substituted for by the Group III oxide.

12. A high density, three-dimensional very fine structure provided by using the three-dimensional very fine patterning method according to claim 8, allowing the selective crystal growth of the Group III-V compound semiconductor on the part substituted for by the Group III oxide or the region other than the part substituted for by the Group III oxide.

13. A high density, three-dimensional very fine structure provided by using the three-dimensional very fine patterning method according to claim 2, adjacent three-dimensional very fine structures are separated below submicrons.

14. A high density, three-dimensional very fine structure provided by using the three-dimensional very fine patterning method according to claim 8, adjacent three-dimensional very fine structures are separated below submicrons.

* * * * *